United States Patent
Lamberts

(10) Patent No.: US 12,031,710 B2
(45) Date of Patent: Jul. 9, 2024

(54) LIGHTING FOR UNDERWATER USE

(71) Applicant: PROPULSION SYSTEMS, Merchtem (BE)

(72) Inventor: Marc Lamberts, Merchtem (BE)

(73) Assignee: PROPULSION SYSTEMS (BE)

( * ) Notice: Subject to any disclaimer, the term of this patent is extended or adjusted under 35 U.S.C. 154(b) by 0 days.

(21) Appl. No.: 18/283,282

(22) PCT Filed: Mar. 17, 2022

(86) PCT No.: PCT/EP2022/057073
§ 371 (c)(1),
(2) Date: Sep. 21, 2023

(87) PCT Pub. No.: WO2022/200186
PCT Pub. Date: Sep. 29, 2022

(65) Prior Publication Data
US 2024/0175570 A1     May 30, 2024

(30) Foreign Application Priority Data

Mar. 24, 2021    (BE) .................................. 2021/5223

(51) Int. Cl.
*F21V 31/00*      (2006.01)
*F21V 23/00*      (2015.01)
(Continued)

(52) U.S. Cl.
CPC .......... *F21V 31/005* (2013.01); *F21V 23/005* (2013.01); *F21V 23/06* (2013.01);
(Continued)

(58) Field of Classification Search
CPC ....... F21V 31/005; F21V 29/58; F21V 23/005
See application file for complete search history.

(56) References Cited

U.S. PATENT DOCUMENTS

| 8,167,468 B1 | 5/2012 | Olsson |
| 9,316,387 B1 * | 4/2016 | Olsson ..................... F21V 5/04 |

(Continued)

FOREIGN PATENT DOCUMENTS

| EP | 1840450 A1 | 10/2007 |
| FR | 2967476 A1 | 5/2012 |

(Continued)

OTHER PUBLICATIONS

International Search Report and Written Opinion for PCT Application No. PCT/EP2022/057073, dated Apr. 25, 2022, 12 pages.
(Continued)

*Primary Examiner* — Karabi Guharay
(74) *Attorney, Agent, or Firm* — Dickinson Wright PLLC

(57) ABSTRACT

A lighting for underwater use provides a pool lighting includes a housing with front and back portion enclosing an internal volume. At least part of the front portion is optically transparent. The lighting comprises a PCB with substrate layer, and at least one light source on a substrate layer front side. The PCB is arranged in the internal volume with the front and back side facing towards the front and back portion. The housing is provided with at least one first opening allowing water to enter the internal volume and have contact with the PCB. The at least one light source is sealed off from contact with water. The lighting comprises an optically transparent electrically insulating waterproof first seal covering at least the at least one light source for sealing it off from contact with water. The front portion of the housing is glued against the PCB by means of the first seal.

20 Claims, 7 Drawing Sheets

(51) Int. Cl.
    *F21V 23/06*     (2006.01)
    *F21V 29/58*     (2015.01)
    *F21V 31/04*     (2006.01)
    *H05K 1/02*     (2006.01)
    *H05K 1/03*     (2006.01)
    *H05K 1/05*     (2006.01)
    *F21W 131/401*     (2006.01)
    *F21Y 115/10*     (2016.01)

(52) U.S. Cl.
    CPC .............. *F21V 29/58* (2015.01); *F21V 31/04* (2013.01); *H05K 1/0203* (2013.01); *H05K 1/0306* (2013.01); *H05K 1/05* (2013.01); *F21W 2131/401* (2013.01); *F21Y 2115/10* (2016.08); *H05K 2201/064* (2013.01); *H05K 2201/09027* (2013.01); *H05K 2201/10106* (2013.01)

(56) References Cited

U.S. PATENT DOCUMENTS

2007/0230194 A1*   10/2007   Julia Vilarrasa ........ F21V 3/062
                                                                                                        362/267
2009/0154164 A1     6/2009   Hsu

FOREIGN PATENT DOCUMENTS

| NO | 2020181249 A1 | 9/2020 |
|---|---|---|
| WO | 2012067659 A1 | 5/2012 |
| WO | 2019028557 A1 | 2/2019 |

OTHER PUBLICATIONS

International Preliminary Report on Patentability for PCT Application No. PCT/EP2022/057073, dated Jun. 14, 2023, 5 pages.

* cited by examiner

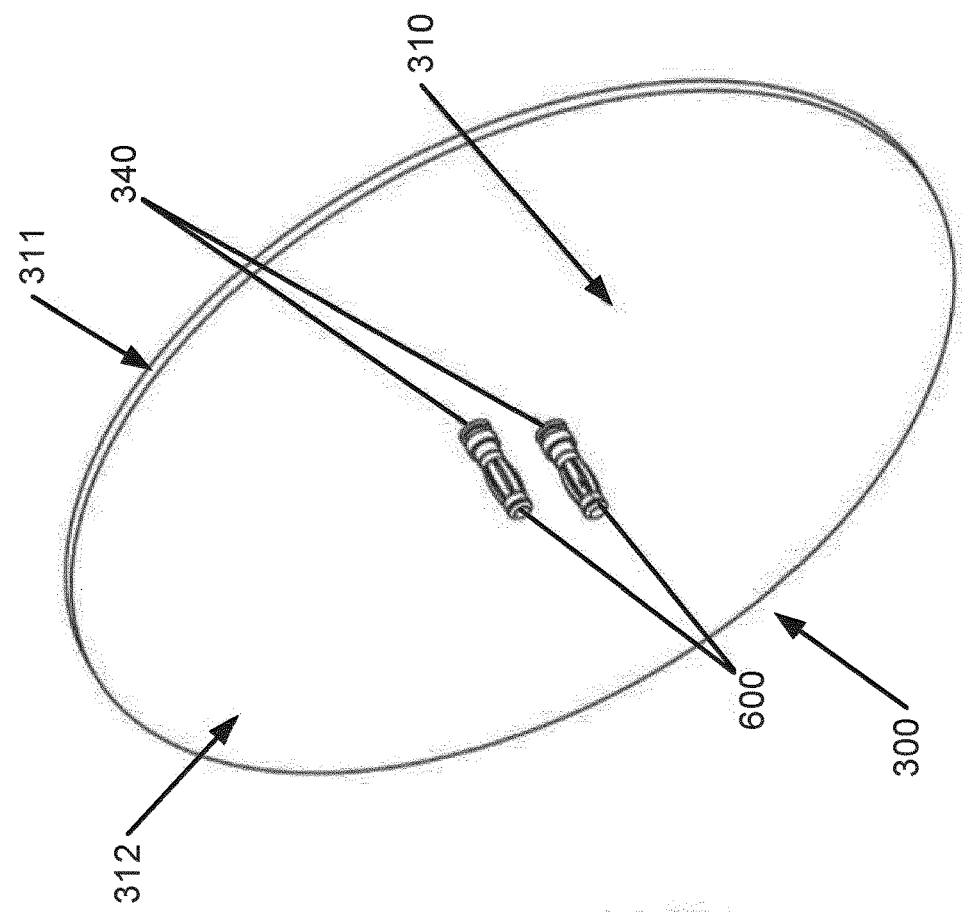
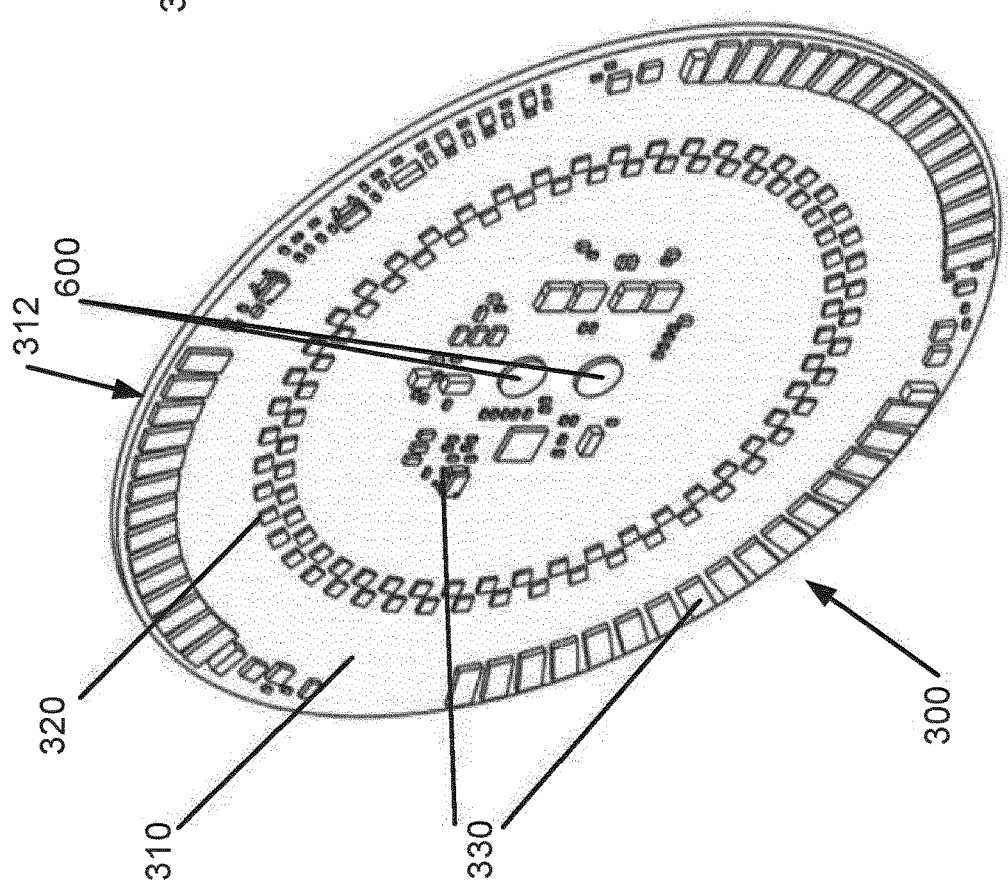
Fig. 2B
Fig. 2A

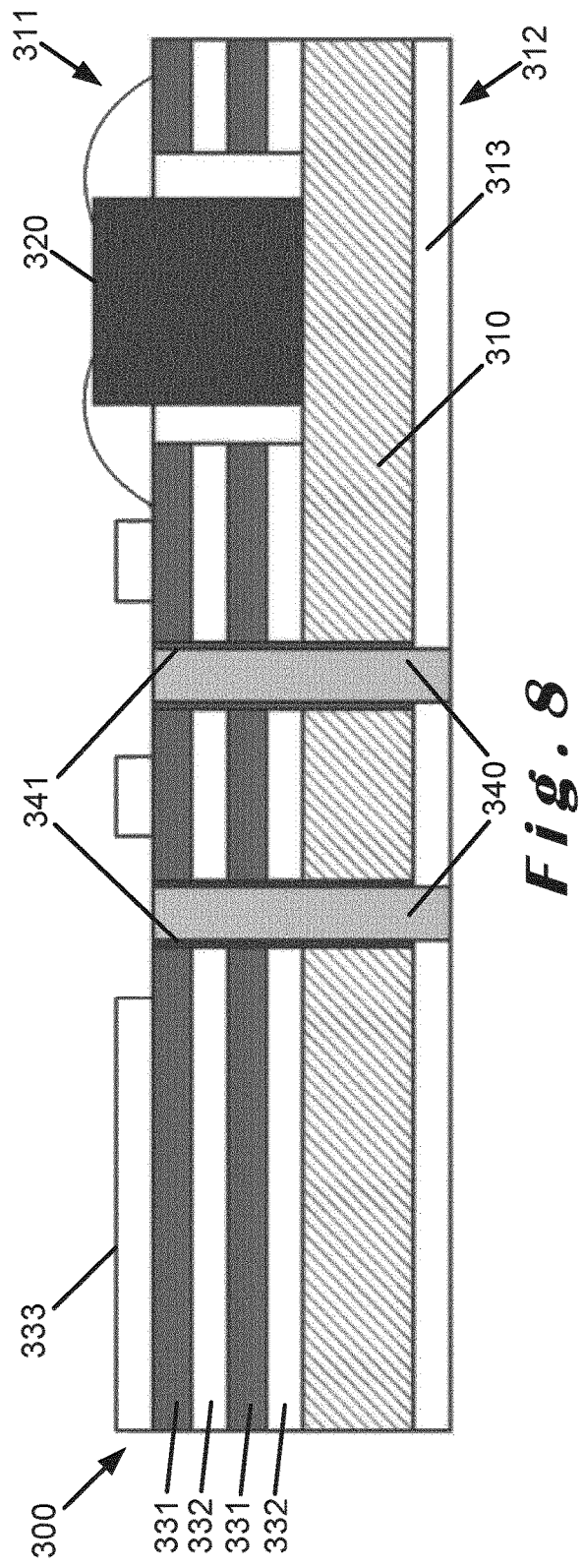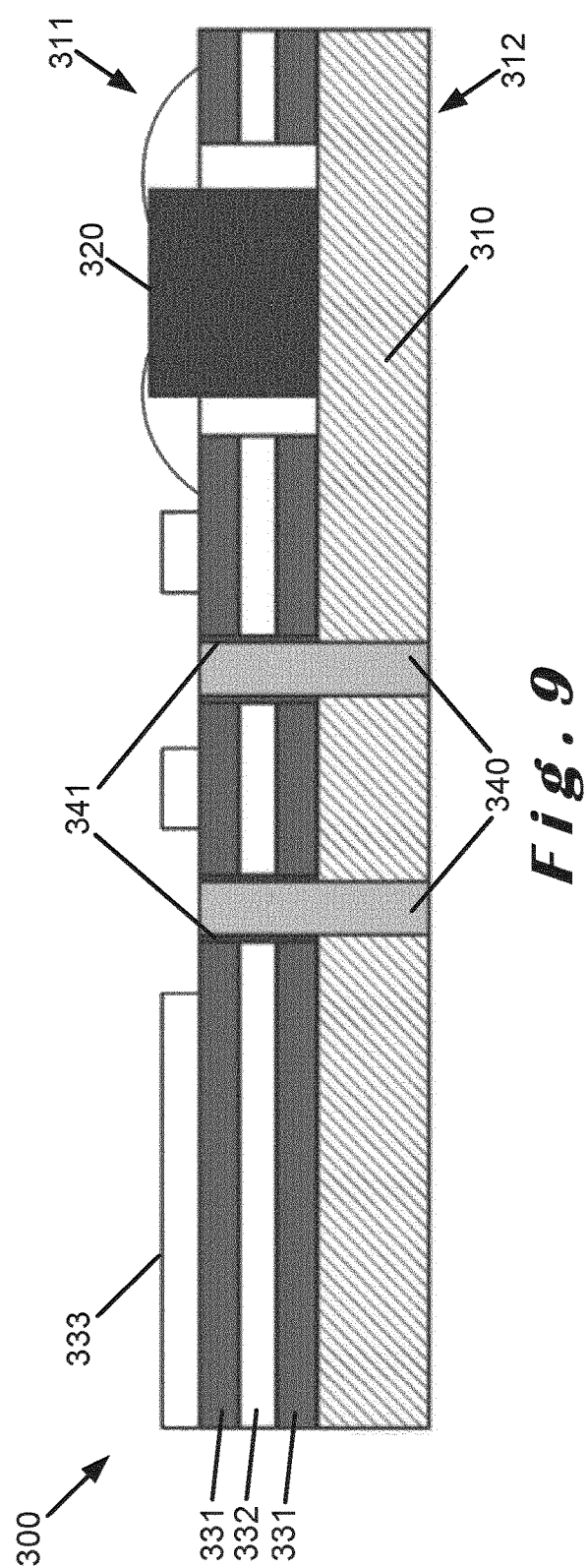

LIGHTING FOR UNDERWATER USE

CROSS-REFERENCE TO RELATED APPLICATION(S)

This present application is a national stage application of International Patent Application No. PCT/EP2022/057073, filed Mar. 17, 2022, which claims priority to Belgium Patent Application No. 2021/5223, filed Mar. 24, 2021, the disclosures of which are hereby incorporated by reference in their entireties.

TECHNICAL FIELD

The present invention relates to a lighting for underwater use.

BACKGROUND ART

Lightings for underwater use, for example for use in a pool, a fountain, a pond, etc., known from the prior art comprise a housing. The housing comprises an optically transparent front portion and a back portion together enclosing an internal volume of the housing. The lighting comprises a printed circuit board, PCB, with a substrate layer and at least one light source, such as a light emitting diode, LED, arranged on a front side of the substrate layer and optionally electronic circuitry associated with the at least one light source arranged on the substrate layer. The PCB is arranged in the internal volume of the housing with the front side of the substrate layer facing towards the front portion of the housing and with a back side of the substrate layer facing towards the back portion of the housing.

Such lightings do however have the disadvantage that it is difficult to remove heat generated by the at least one light source and, if present, the associated electrical circuitry from the housing. Since the PCB is enclosed in the housing and because of the underwater use, the generated heat cannot be removed easily by ventilation. Current solutions, known from the prior art, involve part of the PCB being in direct contact with the housing or with a heat sink in contact with the water to remove the heat more efficiently. These solutions do, however, involve more components, are more costly and more susceptible to failure due to less than optimal contact between the different parts.

DISCLOSURE OF THE INVENTION

It is an aim of the present invention to provide a lighting for underwater use with a more efficient cooling.

This aim is achieved according to the present invention with a lighting for underwater use showing the technical characteristics of the first independent claim.

Therefore, the present invention provides a lighting for underwater use, for example for use in a pool, a fountain, a pond, etc. The lighting comprises a housing. The housing comprises a front portion and a back portion together enclosing an internal volume of the housing. At least a part of the front portion is optically transparent. The lighting comprises a printed circuit board, PCB. The PCB comprises a substrate layer. The PCB comprises at least one light source arranged on a front side of the substrate layer. Optionally, the PCB also comprises, arranged on the substrate layer, preferably on the front side of the substrate layer, electronic circuitry associated with the at least one light source. The associated electronic circuitry may alternatively also be arranged in a safe location outside of the housing and electrically connected from there to the at least one light source on the front side of the substrate layer. The PCB is arranged in the internal volume of the housing with the front side of the substrate layer facing towards the front portion of the housing and with a back side of the substrate layer facing towards the back portion of the housing. The housing is provided with at least one first opening to allow water to enter the internal volume of the housing and have direct contact with the PCB. The at least one light source and, if present, the associated electronic circuitry are sealed off from contact with the water, for example by means of a waterproof seal closing off an area of the internal volume in which the at least one light source and, if present, the associated electronic circuitry are located, or for example by means of a waterproof seal covering the at least one light source and, if present, the associated electronic circuitry.

The lighting according to the present invention offers the advantage that water can enter the internal volume of the housing through the at least one first opening, where it comes into contact with the PCB, except for the at least one light source and, if present, the associated electronic circuitry, for removing heat from the substrate layer which has dissipated from the at least one light source and, if present, the associated electronic circuitry to the substrate layer. Since water has a high heat capacity, the heat can be dissipated more efficiently from the substrate layer, such that the cooling of the at least one light source and, if present, the associated electronic circuitry is improved.

The at least one light source and, if present, the associated electronic circuitry being sealed off from contact with the water is beneficial for safety, since it prevents water from coming into contact with electrical components of the lighting, i.e. the at least one light source and, if present, the associated electronic circuitry.

In an embodiment of the lighting according to the present invention, the lighting comprises an optically transparent, electrically insulating and waterproof first seal covering at least the at least one light source and, if present, the associated electronic circuitry on the front side of the substrate layer for sealing off the at least one light source and, if present, the associated electronic circuitry from contact with the water.

The electrically insulating first seal covering the at least one light source and, if present, the associated electronic circuitry is beneficial for safety, since it prevents electricity from being conducted from the at least one light source and, if present, the associated electronic circuitry to the water via the first seal, and since it prevents the first seal layer from forming undesired electrical connections between portions of the at least one light source and, if present, the associated electronic circuitry.

The at least one light source and, if present, the associated electronic circuitry being arranged on the front side of the substrate layer and the waterproof first seal covering the at least one light source and, if present, the associated electronic circuitry is beneficial for safety, since it prevents water from coming into contact with electrical components of the lighting, i.e. the at least one light source and, if present, the associated electronic circuitry.

The first seal being optically transparent offers the advantage that, although the at least one light source is covered by the first seal, light can still be emitted from the at least one light source through the optically transparent front portion of the housing.

In an embodiment of the lighting according to the present invention, the substrate layer is an electrical insulator.

This embodiment is beneficial for safety, since it prevents electricity from being conducted from the at least one light source and, if present, the associated electronic circuitry to the water via the substrate layer, and since it prevents the substrate layer from forming undesired electrical connections between portions of the at least one light source and, if present, the associated electronic circuitry.

In an embodiment of the lighting according to the present invention an electrically insulating layer is arranged between the substrate layer on the one hand and the at least one light source and, if present, the associated electronic circuitry on the other hand.

This embodiment is beneficial for safety, since it prevents electricity from being conducted from the at least one light source and, if present, the associated electronic circuitry to the water via the substrate layer, and since it prevents the substrate layer from forming undesired electrical connections between portions of the at least one light source and, if present, the associated electronic circuitry, and this even in the case that the substrate layer is an electrical conductor.

In an embodiment of the lighting according to the present invention the substrate layer is an electrical conductor.

In an embodiment of the lighting according to the present invention the material of the substrate layer is a non-corrosive material.

This embodiment offers the advantage that the substrate layer is prevented from corroding by exposure to water.

In an embodiment of the lighting according to the present invention the material of the substrate layer is a thermally conductive material.

This embodiment offers the advantage that heat generated by the at least one light source and, if present, the associated electronic circuitry can be dissipated efficiently from the at least one light source and, if present, the associated electronic circuitry to the water via the substrate layer.

In an embodiment of the lighting according to the present invention the back portion of the housing is provided with the at least one first opening. This embodiment offers the advantage that water entering the internal volume of the housing is directed to the back side of the substrate layer, which forms the largest free surface on the substrate layer for dissipating heat from the at least one light source and, if present, the associated electronic circuitry since it is not sealed off from contact with the water because the at least one light source and, if present, the associated electronic circuitry are arranged on the front side of the substrate layer.

In an embodiment of the lighting according to the present invention the first seal covers the PCB over the entire front side of the substrate layer.

This embodiment is beneficial for safety, since the first seal covering the PCB over the entire front side of the substrate layer further reduces the risk of any water reaching the at least one light source and, if present, the associated electronic circuitry on the front side of the substrate layer.

In an embodiment of the lighting according to the present invention the first seal fills at least the space of the internal volume between on the one hand the at least one light source and, if present, the associated electronic circuitry on the front side of the substrate layer and on the other hand the front portion of the housing. In an embodiment of the lighting according to the present invention the first seal fills the space of the internal volume between the PCB and the front portion of the housing. Preferably, the first seal thereby completely fills said space of the internal volume, i.e. such that no air bubbles are present between the PCB and the front portion of the housing.

These embodiment are beneficial for safety, since they prevent water from getting in said space of the internal volume, such that the risk of any water reaching the at least one light source and, if present, the associated electronic circuitry on the front side of the substrate layer is further reduced.

In an embodiment of the lighting according to the present invention exposed sections of the substrate layer of the PCB in contact with the water, are provided with a non-corrosive protective coating.

This embodiment offers the advantage that the substrate layer is prevented from corroding by exposure to water.

In an embodiment of the lighting according to the present invention the protective coating is in a thermally conductive material.

This embodiment offers the advantage that heat can be dissipated efficiently from the substrate layer to the water via the protective coating.

In an embodiment of the lighting according to the present invention the lighting comprises at least one electrical connector connected to the at least one light source at the front side of the substrate layer of the PCB and/or, if present, the electrical circuitry associated with the at least one light source at the front side of the substrate layer of the PCB, wherein the at least one electrical connector extends through at least one through opening in the PCB going from the front side of the substrate layer to the back side of the substrate layer, further through the internal volume of the housing, and further through at least one second opening provided in the housing, and wherein the lighting comprises a waterproof second seal between the back side of the substrate layer and the housing, which second seal surrounds the portion of the at least one electrical connector extending through the internal volume of the housing.

This embodiment is beneficial to provide electrical power to the at least one light source and/or, if present, the associated electrical circuitry in such a manner that the at least one electrical connector cannot come into contact with water inside the housing. This beneficial for the safety of the lighting.

In an embodiment of the lighting according to the present invention the walls of the at least one through opening are provided with electrical insulation.

This embodiment is beneficial for safety, since the electrical insulation on the walls of the at least one through opening prevents the electrical connector from making an undesired electrical contact with any electrically conducting component of the at least one light source, if present, the associated electronic circuitry and the substrate layer.

In an embodiment of the lighting according to the present invention the at least one second opening is provided in the back portion of the housing.

This embodiment offers the advantage that the at least one electrical connector can be arranged such that it only extends over a short distance through the internal volume of the housing from the back side of the substrate layer to the at least one second opening in the back portion of the housing to which the back side of the substrate layer is facing. In this way, only a small second seal is needed to surround the portion of the at least one electrical connector extending through the internal volume of the housing, such that the risk of any water from coming into contact with the at least one electrical connector through the second seal is further reduced.

In an embodiment of the lighting according to the present invention the at least one light source is a light emitting diode, LED.

In an embodiment of the lighting according to the present invention the front portion of the housing is a glass plate.

In an embodiment of the lighting according to the present invention the front portion of the housing is glued against the PCB by means of the first seal.

This embodiment is beneficial for safety, since it prevents water from getting in the space of the internal volume between on the one hand the at least one light source and, if present, the associated electronic circuitry on the front side of the substrate layer and on the other hand the front portion of the housing, such that the risk of any water reaching the at least one light source and, if present, the associated electronic circuitry on the front side of the substrate layer is further reduced.

In an embodiment of the lighting according to the present invention the PCB comprises a plurality of the light sources arranged on the front side of the substrate layer, wherein the back portion of the housing is provided with a plurality of the first openings to allow water to enter the internal volume of the housing, and wherein the plurality of the first openings are positioned on the back portion of the housing in an arrangement corresponding to an arrangement in which the plurality of the light sources are positioned on the front side of the substrate layer.

This embodiment has the advantage that the cooling of the water in the internal volume of the housing is directed to the parts of the substrate layer that lie directly behind the light sources, which generate the most heat.

BRIEF DESCRIPTION OF THE DRAWINGS

The invention will be further elucidated by means of the following description and the appended figures.

FIG. 2A shows a perspective view of on the front of the PCB of the lighting of FIG. 1A.

FIG. 2B shows a perspective view of on the back of the PCB of the lighting of FIG. 1A.

FIG. 8 shows a schematic representation of a PCB of a lighting according to an embodiment of the present invention.

FIG. 9 shows a schematic representation of a PCB of a lighting according to an embodiment of the present invention.

MODES FOR CARRYING OUT THE INVENTION

Figure 1B:
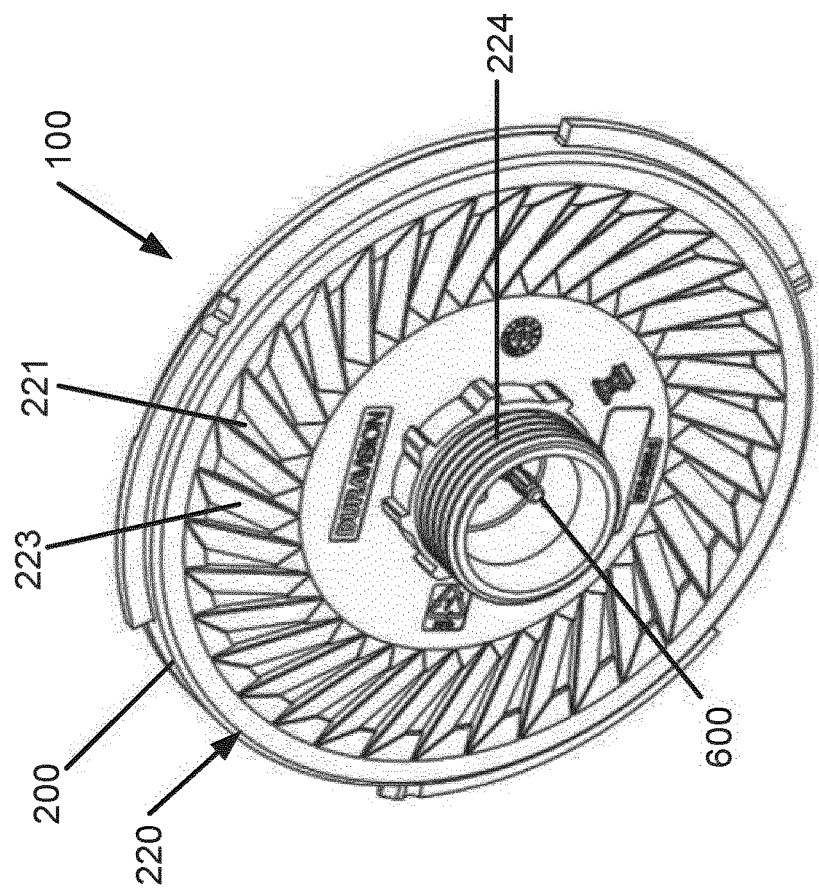
FIG. 1B shows a perspective view of the back of the lighting of FIG. 1A.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Figure 1A:
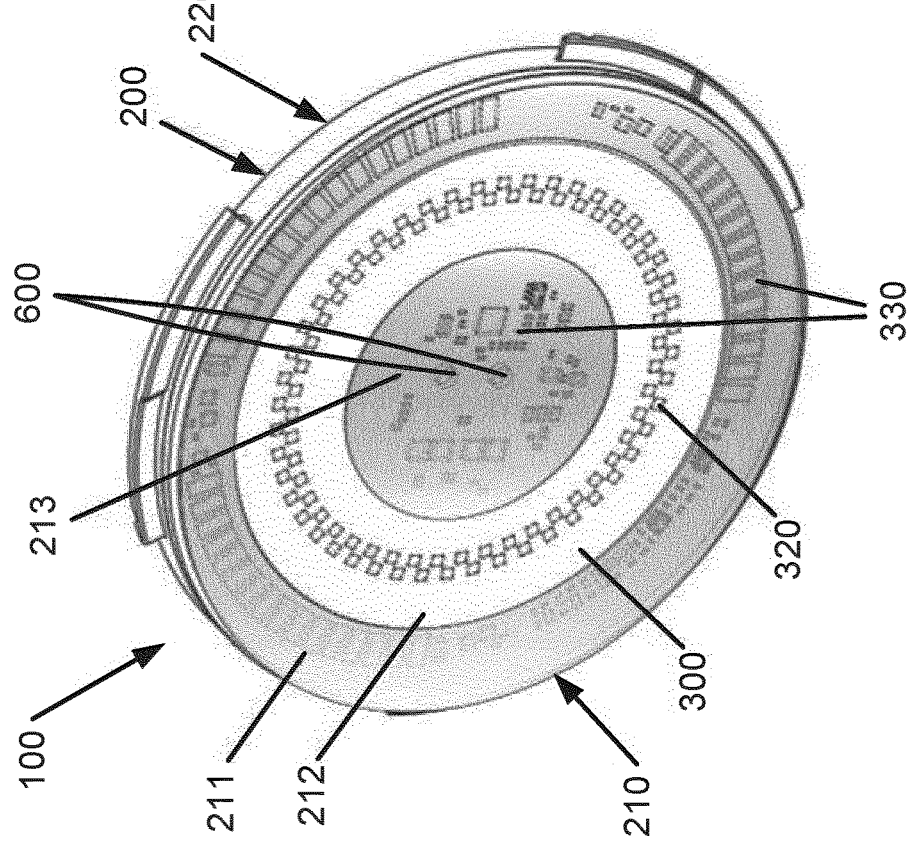
FIG. 1A shows a perspective view of the front of a lighting according to an embodiment of the present invention.
Figure 3:
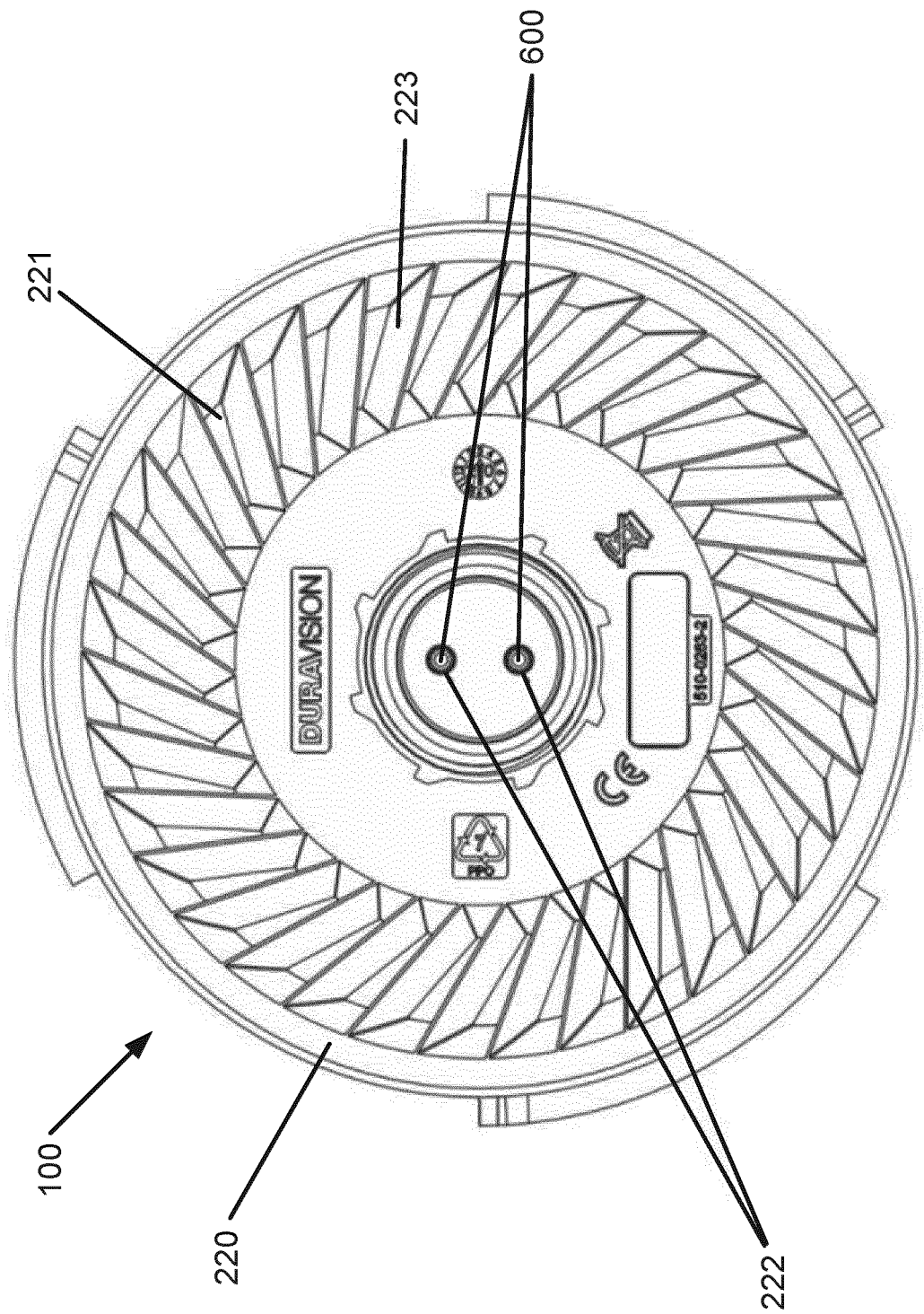
FIG. 3 shows a back view of the lighting of FIG. 1A.
Figure 4:
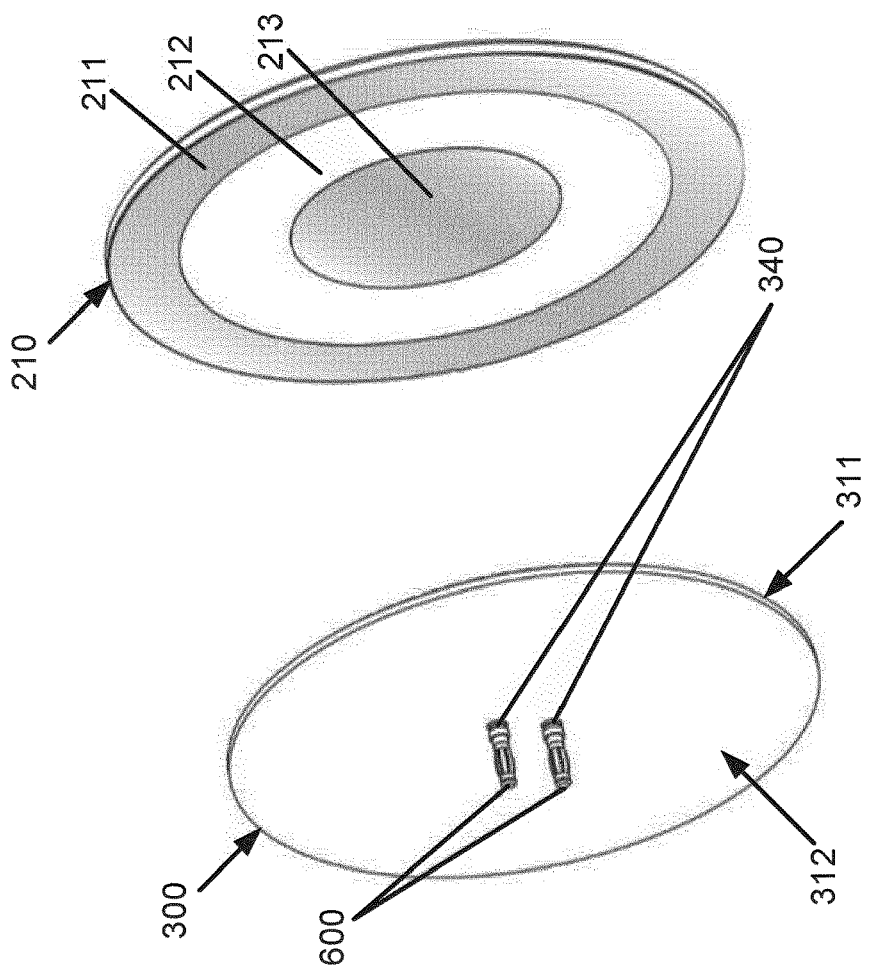
FIG. 4 shows in an exploded view the housing and the PCB of the lighting of FIG. 1A.
Figure 4:
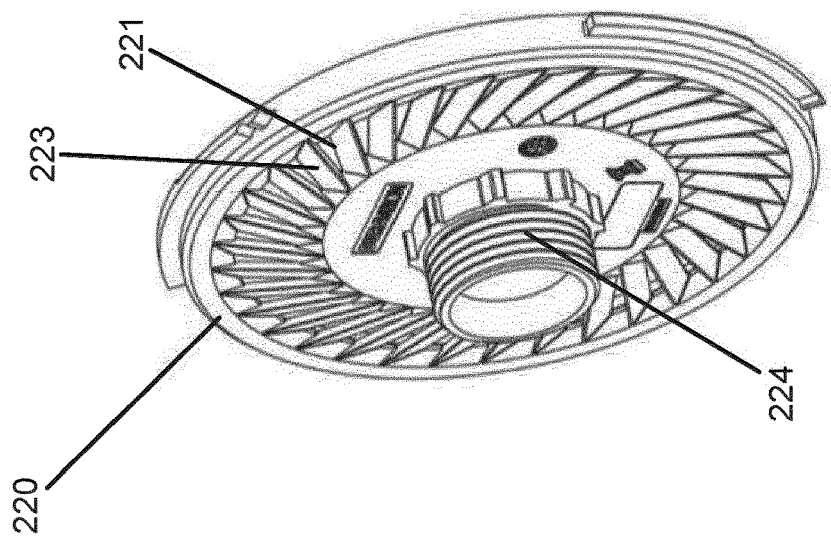
Figure 5:
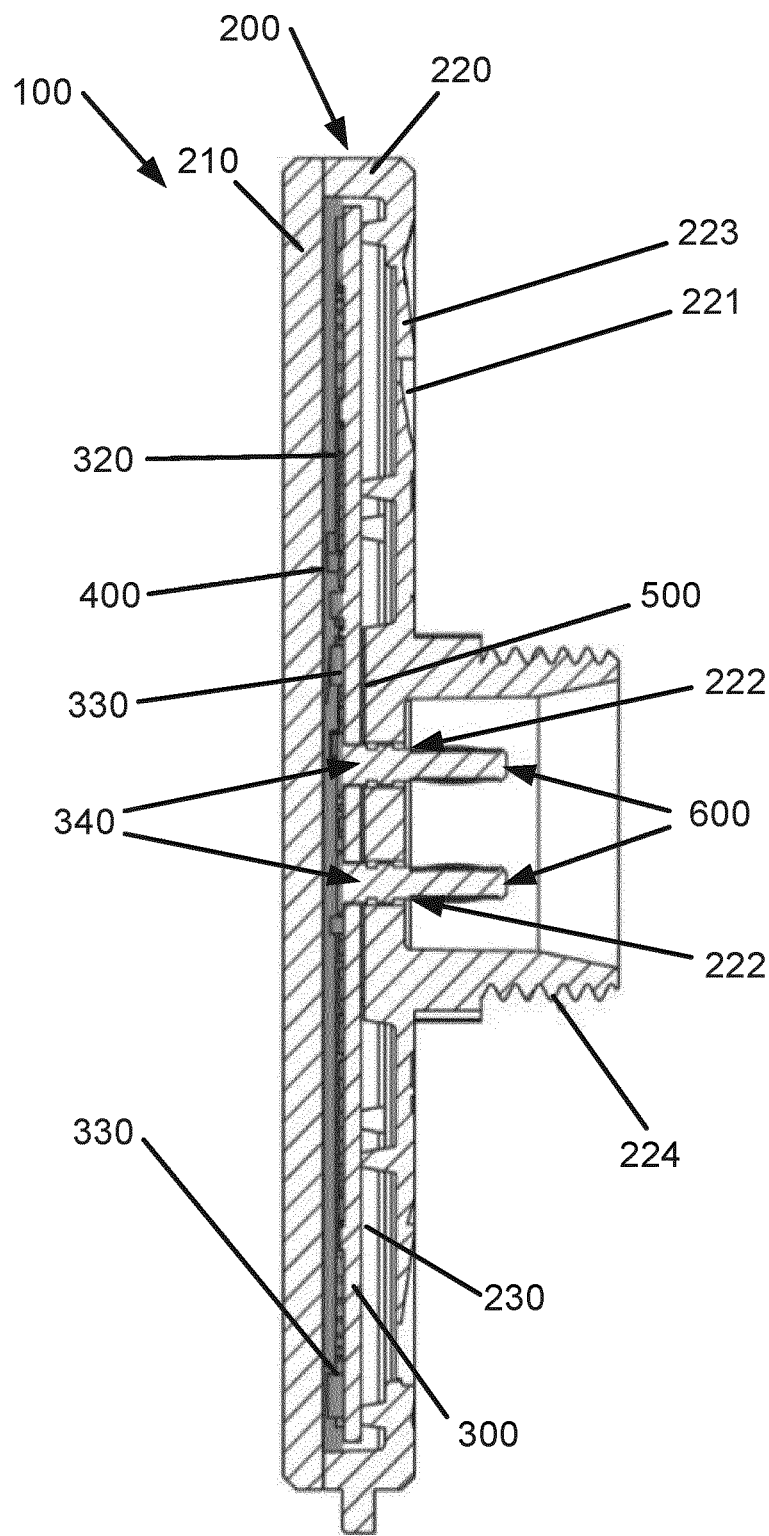
FIG. 5 shows a cross section through the lighting of FIG. 1A.

FIGS. 1A and 1B show a lighting 100 according to an embodiment of the present invention respectively from the front and the back in a perspective view. FIGS. 3, 4 and 5 show the same lighting 100 respectively in a back view, an exploded view of the housing and the PCB, and a cross section centrally through the lighting 100.

The lighting 100 comprises a housing 200. The housing 200 comprises a front portion 210 and a back portion 220 which are connected to each other, for example by gluing or ultrasonic melting, thereby enclosing an internal volume 230 of the housing 200. It should be clear that any other suitable manner known by the skilled person for connecting the front portion 210 and the back portion 220 can be used.

In the internal volume 230 of the housing 200, there is arranged a printed circuit board, PCB 300, which is shown in more detail in the FIGS. 2A an 2B, respectively from the front and the back in a perspective view. The PCB 300 comprises a substrate layer 310 having a front side 311 and a back side 312. The PCB 300 is arranged in the housing 200 such that the front side 311 of the substrate layer 310 is facing towards the front portion 210 of the housing 200, and such that the back side 312 of the substrate layer 310 is facing towards the back portion 220 of the housing 200. The material of the substrate layer 310 is preferably a non-corrosive material to protect the substrate layer 310 against corrosion damage from water in the internal volume 230 of the housing 200. For this purpose, the substrate layer 310, or at least the portions of the substrate layer 310 that are facing the internal volume 230 of the housing 200 and thus exposed to water in the internal volume 230 of the housing 200, may optionally also be covered with a protective coating 313 in a non-corrosive material.

The front side 311 of the substrate layer 310 is provided with a plurality of light emitting diodes, LEDs 320, and electronic circuitry 330 that is associated with the LEDs 320. Alternatively, such associated electronic circuitry 330 can be arranged outside of the housing 200. The LEDs 320 are used as the light sources of the lighting 100, but it should be clear that another suitable type of light source known to the skilled person can be used. The LEDs 320 and the associated electronic circuitry 330 are electrically insulated from the substrate layer 310, such that no undesired electrical connections are formed in the LEDs 320 and the associated electronic circuitry 330 by the substrate layer 310, which electrical connections might for example cause a short circuit. This electrical insulation may for example be achieved by providing the substrate layer itself in an electrically insulating material, such as for example ceramic, or for example by providing an electrically insulating layer 332 between the substrate layer 310 on the one hand and the LEDs 320 and the associated electronic circuitry 330 on the other hand, such as shown in the FIGS. 6-8, which will be discussed in more detail below.

The components of the electronic circuitry 330 are arranged on the front side 311 of the substrate layer 310 along an outer circle at the circumference of the substrate layer 310 and in an inner circle at the centre of the substrate layer 310. The LEDs 320 are arranged on the front side 311 of the substrate layer 310 along an intermediate circle in between the outer circle and the inner circle. The present invention is however not limited to this arrangement of the LEDS 320 and the associated electronic circuitry 330, and it should be clear that other arrangements can be used.

The back side 312 of the substrate layer 310 is left mostly blank, except for two electrical connectors 600 protruding from back side 312 of the substrate layer 310. These electrical connectors 600 can also be seen at the front side 311 of the substrate layer 310, where they are connected, for example by soldering, to the electronic circuitry 330 associated with the LEDs 320, and through which electrical power can be provided to said electronic circuitry 330 and the LEDs 320. From the front side 311 of the substrate layer 310, the two electrical connectors 600 extend through two through openings 340 in the substrate layer 310, to the back side 312 of the substrate layer 310. The through openings 340 preferably have a diameter in the range from 0.1 mm to 20 mm. From the back side 312 of the substrate layer 310, the electrical connectors 600 extend further through the internal volume 230 of the housing 200, and through two second openings 222 in the back portion 220 of the housing 200 to the exterior of the housing 200. At the exterior of the housing 200, the back portion of the housing 200 is provided with a mechanical connector 224 surrounding the two second openings 220 and the electrical connectors 600 protruding through the second openings 220. This mechanical connector 224 is provided for establishing a waterproof connecting with a socket (not shown) providing electrical wiring to the electrical connectors 600.

In the embodiment shown the front portion 210 of the housing 200 is a glass plate 210 or lens 210. The glass plate 210 in itself is optically transparent, i.e. transparent at least for visible light, such that light can be emitted from the LEDs 320 within the housing 200 through the front portion 210 to the exterior of the housing 200. In this embodiment, the glass plate 210 is provided with a first translucent area 211 and a second translucent area 213. The first translucent area 211 and the second translucent area 213 are printed on the glass plate 210 at side of the glass plate 210 directed to the inside of the housing 200. The first translucent area 211 is ring shaped and located at the circumference of the circular shaped glass plate 210, and the second translucent area 213 is circular shaped and located at the centre of the circular shaped glass plate. In between the first translucent area 211 and the second translucent area 213 there is left a ring shaped transparent area 212. The first translucent area 211 and the second translucent area 213 lie above the electronic circuitry 330 on the front side 311 of the substrate layer 310, such that the electronic circuitry 330 is not visible from the exterior of the housing 200. The transparent area 212 lies above the LEDs 320 on the front side 311 of the substrate layer 310 to allow light emitted by the LEDs 320 to pass through the glass plate 310 to the exterior of the housing 200.

In alternative embodiments other types of front portion, instead of a glass plate 210, can however be used as long as at least a part of the front portion is optically transparent such that light can be emitted by the LEDs 320 from within the housing 200 through the front portion 210 to the exterior of the housing 200.

The PCB 300 is sealed, for example by gluing, to the glass plate 210 by means of a first seal 400. The first seal 400 completely fills the space of the internal volume 230 of the housing 200 that is located between the glass plate 210 and the front side 311 of the substrate layer 310 of the PCB 300. Thereby, the first seal completely covers the front side 311 of the substrate layer 310, and thus also the LEDs 320 and the associated electronic circuitry 330 arranged on the front side 311 of the substrate layer 310. The material of the first seal 400 is a waterproof material such that water in the internal volume 230 of the housing 200 cannot come into contact with the LEDs 320 and the associated electronic circuitry 330 at the front side 311 of the substrate layer 310. The material of the first seal 400 is also an electrically insulating material such that no undesired electrical connections are formed in the LEDs 320 and the associated electronic circuitry 330 by the first seal 400, which electrical connections might for example cause a short circuit. The material of the first seal 400 is also an optically transparent material such that light emitted by the LEDs 320 can pass through the first seal 400 to the glass plate 210 and the exterior of the housing 200.

The PCB 300 is also sealed, for example by gluing, with the back side 312 of the substrate layer 310 to the back portion 220 of the housing 200 by means of a second seal 500. Thereby, the second seal 500 completely surrounds the portion of the electrical connectors 600 that extends through the internal volume 230 of the housing 200. The material of the first seal 400 is a waterproof material such that water in the internal volume 230 of the housing 200 cannot come into contact with the electrical connectors 600.

For cooling the LEDs 320 and the associated electronic circuitry 330 of the PCB 300 in the housing 200, the back portion 220 of the housing 200 is provided with a plurality of first openings 221 which allow water to enter the internal volume 230 of the housing 200, except for the areas of the internal volume 230 where the first seal 400 and the second seal 500 are located, since they are waterproof for protecting the LEDs 320, the associated electronic circuitry 330 and the electronic connectors 600 from coming into contact with the water. The back portion 220 of the housing is provided at the first openings 221 with fins 223, which aid in guiding water in and out of the internal volume 230 of the housing 200. The plurality of first openings 221 are arranged on the back portion 220 of the housing along a circle which corresponds to the intermediate circle along which the LEDs 320 are arranged on the front side 311 of the substrate layer 310. This arrangement has the advantage that the cooling of the water in the internal volume 230 of the housing 200 is directed to parts of the substrate layer 310 that lie directly behind the LEDs 320, which generate the most heat. In general, it is preferable that, independent of the arrangement of the LEDs on the front side 311 of the substrate layer 310, the plurality of first openings 221 in the back portion 220 of the housing 200 are positioned in a similar or corresponding arrangement on the back portion 220 of the housing 200 as the arrangement of the LEDs 320 on the front side 311 of the substrate layer 310.

In this configuration, heat generated by the LEDs 320 and the associated electronic circuitry 330 is dissipated through the substrate layer 310 from the front side 311 to the back side 312 of the substrate layer 310 and further to the water in the internal volume 230 of the housing 200 which is in contact with the back side 312 of the substrate layer 310. Cooling in this manner has the advantage that much heat can be dissipated, since water has a high heat capacity, and heated water in the internal volume 230 of the housing 200 can be replenished by fresh water entering from the pool, for example due to movement of the water.

To allow for an efficient cooling of the LEDs 320 and the associated electronic circuitry 330, the material of the substrate layer 310 and that of an optional protective coating 313 on the substrate layer 310, is preferably a thermally conductive material which allows for a quick dissipation of heat from the LEDs 320 and the associated electronic circuitry 330 to water in the internal volume 230 of the housing 200 that comes into contact with the substrate layer 310 or the optional protective coating 313.

Each of the FIGS. 6-9 shows in cross section a schematic representation of an exemplary embodiment of a PCB 300 for use in a lighting 100 according to the present invention. These PCBs 300 can be assembled by means of a Surface Mount Technology, SMT, manufacturing process or a similar process.

Figure 6:
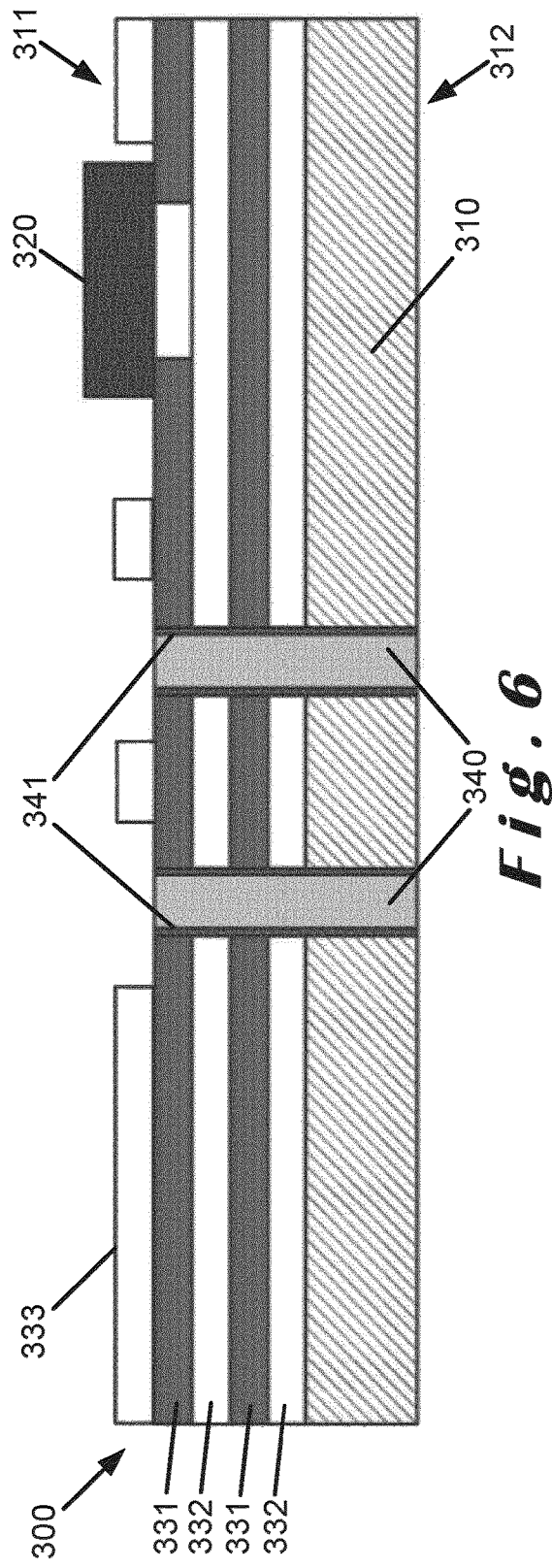
FIG. 6 shows a schematic representation of a PCB of a lighting according to an embodiment of the present invention.

The PCB 300 shown in FIG. 6, comprises a metal core substrate layer 310. A first electrically insulating or dielectric layer 332 is arranged as a first layer on the front side 311 of the substrate layer 310, which first electrically insulating layer 332 preferably has a thickness of 0.025 mm. The first electrically insulating layer 332 is put on the metal core substrate layer 310 to electrically insulate the LEDs 320 and the associated electronic circuitry 330 arranged on the front side 311 of the substrate layer 310 from the metal core substrate layer 310 to avoid short circuit. In this embodiment, the associated electronic circuitry 330 comprises a first electrically conductive layer 331, a second electrically insulating layer 332, a second electrically conductive layer 331 and a solder mask layer 333, which layers are stacked on top of each other on the first electrically insulating layer 332. The LEDs 320 can be mounted in different ways on this stack. In this case, the LEDs 320 are soldered directly onto the second conductive layer 331. Two through openings 340 for the electrical connectors 600 are provided through the PCB 300. The through openings 340 are provided with an electrical insulation layer 341 on their walls to avoid electrical contact between the electrical connectors 600 and the metal core substrate layer 310. This insulation layer 341 is typically an epoxy material.

Figure 7:
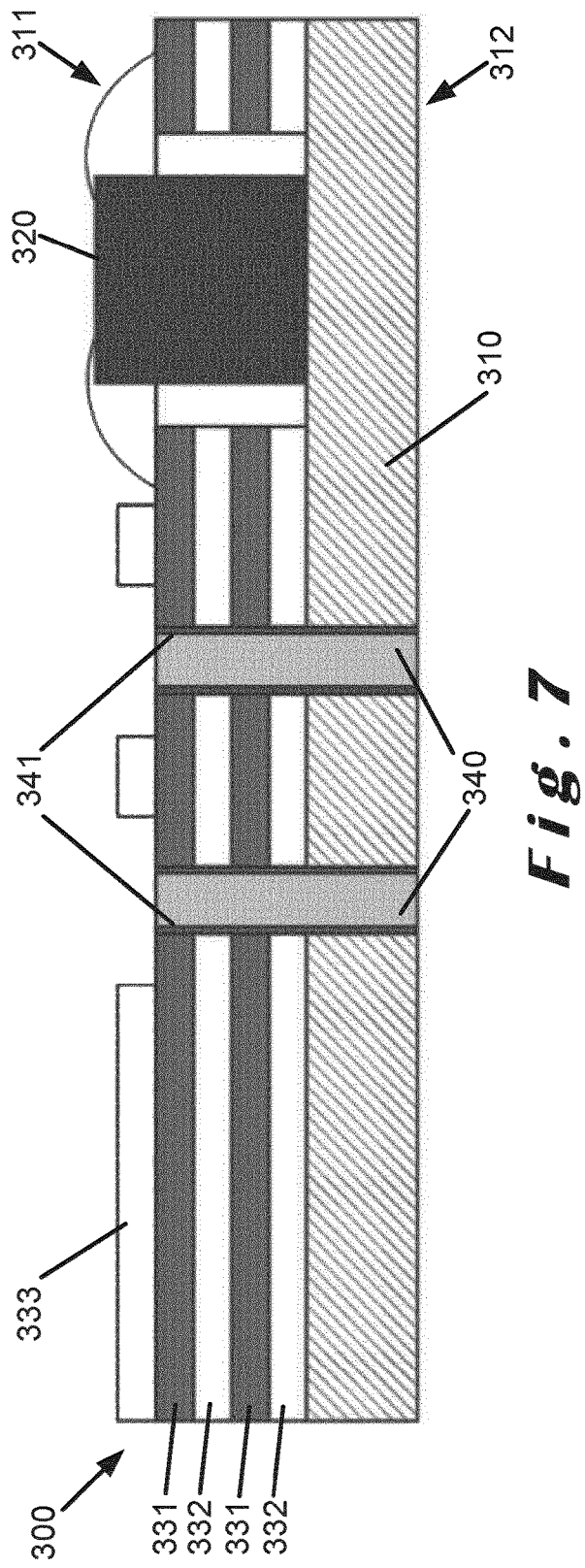
FIG. 7 shows a schematic representation of a PCB of a lighting according to an embodiment of the present invention.

The PCB 300 shown in FIG. 7 is similar to the PCB 300 of FIG. 6, but here a COB flip chip LED 320 is used as the light source. The COB flip chip LED 320 is soldered to the second electrically conductive layer 331. The COB flip chip LED 320 is making a direct electrically insulated contact with the metal core substrate layer 310 for efficient heat dissipation from the COB flip chip LED 320 through the metal core substrate layer 310 to the swimming water in the internal volume 230 of the housing 200.

The PCB 300 shown in FIG. 8 is similar to the PCB 300 of FIG. 7, but here the metal core substrate layer 310 is provided at the back side 312 with a protective coating 313 which must protect the metal core substrate layer 310 against the swimming water in the internal volume 230 of the housing 200. The protective coating 313 has a high thermal conductivity coefficient for efficient heat dissipation through the protective coating 313.

The PCB 300 shown in FIG. 9, comprises a ceramic substrate layer 310. In this embodiment, the associated electronic circuitry 330 comprises a first electrically conductive layer 331, an electrically insulating layer 332, a second electrically conductive layer 331 and a solder mask layer 333, which layers are stacked on top of each other on the front side 311 of the ceramic substrate layer 310. No electrically insulating layer needs to be provided between the associated electronic circuitry 330 and the ceramic substrate layer 310, such as in the embodiments of FIGS. 6-8, since the ceramic substrate layer 310 itself is an electrical insulator. For the same reason, the two through openings 340 for the electrical connectors 600 do not require an electrical insulation layer 341 on their walls at the level of the ceramic substrate layer 310, but only at the level of the associated electronic circuitry 330.

In this embodiment the LED 320 is a COB flip chip LED 320 which is soldered to the second electrically conductive layer 331. The COB flip chip LED 320 is making direct contact with the ceramic substrate layer 310 for efficient heat dissipation from the COB flip chip LED 320 through the ceramic core substrate layer 310 to the swimming water in the internal volume 230 of the housing 200.

REFERENCES 100 lighting 311 front side
200 housing 312 back side
210 front portion 313 protective coating
211 first translucent area 320 LED
212 transparent area 330 electronic circuitry
213 second translucent area 331 conductive layer
220 back portion 332 insulating layer
221 first opening 333 solder mask layer
222 second opening 340 through opening
223 ribs 341 electrical insulation
224 mechanical connector 400 first seal
230 internal volume 500 second seal
300 PCB 501 opening
310 substrate layer 600 electrical connector

The invention claimed is:

1. A lighting (100) for underwater use comprising:
a housing comprising a front portion and a back portion together enclosing an internal volume of the housing, wherein at least a part of the front portion is optically transparent; and
a printed circuit board, PCB, comprising a substrate layer and at least one light source arranged on a front side of the substrate layer, wherein the PCB is arranged in the internal volume of the housing with the front side of the substrate layer facing towards the front portion of the housing and with a back side of the substrate layer facing towards the back portion of the housing; and
wherein the back portion of the housing is provided with at least one first opening to allow water to enter the internal volume of the housing and have direct contact with the substrate layer of the PCB, and wherein the at least one light source is sealed off from contact with the water, wherein the lighting comprises an optically transparent, electrically insulating and waterproof first seal covering at least the at least one light source on the front side of the substrate layer for sealing off the at least one light source from contact with the water, and wherein the front portion of the housing is glued against the PCB by means of the optically transparent, electrically insulating and waterproof first seal.

2. The lighting according to claim 1, wherein the PCB comprises electronic circuitry associated with the at least one light source, wherein the electronic circuitry is arranged on the substrate layer, and wherein the electronic circuitry is sealed off from contact with the water.

3. The lighting according to claim 2, wherein the optically transparent, electrically insulating and waterproof first seal further covers at least the electronic circuitry on the front side of the substrate layer for sealing off the electronic circuitry from contact with the water.

4. The lighting according to claim 2, wherein an electrically insulating layer is arranged between the substrate layer and the at least one light source and, if present, the electronic circuitry.

5. The lighting according to claim 4, wherein the substrate layer is an electrical conductor.

6. The lighting according to claim 2, wherein the optically transparent, electrically insulating and waterproof first seal fills at least a space of the internal volume between on the one hand the at least one light source and, if present, the electronic circuitry on the front side of the substrate layer and on the other hand the front portion of the housing.

7. The lighting according to claim 2, wherein the lighting comprises at least one electrical connector connected to at least one of the at least one light source at the front side of the substrate layer of the PCB and, if present, the electronic circuitry associated with the at least one light source at the front side of the substrate layer of the PCB, wherein the at least one electrical connector extends through at least one through opening in the PCB going from the front side of the substrate layer to the back side of the substrate layer further through the internal volume of the housing and further through at least one second opening provided in the housing, and wherein the lighting comprises a waterproof second seal between the back side of the substrate layer and the housing which second seal surrounds the portion of the at least one electrical connector extending through the internal volume of the housing.

8. The lighting according to claim 7, wherein walls of the at least one through opening are provided with electrical insulation.

9. The lighting according to claim 7, wherein the at least one second opening is provided in the back portion of the housing.

10. The lighting according to claim 1, wherein the substrate layer is an electrical insulator.

11. The lighting according to claim 1, wherein the substrate layer is ceramic.

12. The lighting according to claim 1, wherein a material of the substrate layer is a non-corrosive material.

13. The lighting according to claim 1, wherein a material of the substrate layer is a thermally conductive material.

14. The lighting according to claim 1, wherein the optically transparent, electrically insulating and waterproof first seal covers the PCB over an entire front side of the substrate layer.

15. The lighting according to claim 1, wherein the optically transparent, electrically insulating and waterproof first seal fills the space of the internal volume between the PCB and the front portion of the housing.

16. The lighting according to claim 1, wherein exposed sections of the substrate layer of the PCB in contact with the water, are provided with a non-corrosive protective coating.

17. The lighting according to claim 16, wherein the non-corrosive protective coating is in a thermally conductive material.

18. The lighting according to claim 1, wherein the at least one light source is a light emitting diode, LED.

19. The lighting according to claim 1, wherein the front portion of the housing is a glass plate.

20. The lighting according to claim 1, wherein the PCB comprises a plurality of the light sources arranged on the front side of the substrate layer, wherein the back portion of the housing is provided with a plurality of the first openings to allow water to enter the internal volume of the housing, and wherein the plurality of the first openings are positioned on the back portion of the housing in an arrangement corresponding to an arrangement in which the plurality of the light sources are arranged on the front side of the substrate layer.

* * * * *